United States Patent
Degner et al.

(10) Patent No.: US 9,553,540 B2
(45) Date of Patent: Jan. 24, 2017

(54) POWER CONVERTER WITH PRE-COMPENSATION FOR DEAD-TIME INSERTION

(71) Applicant: FORD GLOBAL TECHNOLOGIES, LLC, Dearborn, MI (US)

(72) Inventors: Michael W. Degner, Novi, MI (US); Chingchi Chen, Ann Arbor, MI (US); Jun Kikuchi, Novi, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 175 days.

(21) Appl. No.: 14/601,300

(22) Filed: Jan. 21, 2015

(65) Prior Publication Data

US 2016/0211774 A1    Jul. 21, 2016

(51) Int. Cl.
*H02P 1/30* (2006.01)
*H02P 1/52* (2006.01)
(Continued)

(52) U.S. Cl.
CPC .......... *H02P 27/08* (2013.01); *H02M 7/53875* (2013.01); *G01R 19/0092* (2013.01);
(Continued)

(58) Field of Classification Search
CPC ..... H02P 27/04; G01R 19/0092; G01R 31/42; H02M 5/458; H02M 7/003
(Continued)

(56) References Cited

U.S. PATENT DOCUMENTS 5,990,657 A    11/1999    Masaki et al.
6,535,402 B1    3/2003    Ying et al.
(Continued)

FOREIGN PATENT DOCUMENTS

JP    02179277    12/1990
JP    03089868    4/1991
JP    07007967    1/1995

OTHER PUBLICATIONS

Lihua Chen et al, Dead-Time Elimination for Voltage Source Inverters, IEEE Transactions on Power Electronics, vol. 23, No. 2, Mar. 2008.
(Continued)

*Primary Examiner* — Shawki S Ismail
*Assistant Examiner* — Bradley Brown
(74) *Attorney, Agent, or Firm* — David B. Kelley; MacMillan, Sobanski & Todd, LLC

(57) ABSTRACT

A power converter has a phase leg with upper and lower switching devices coupled across a DC link. A junction between the devices is coupled to a load. A current sensor detects direction of current flow from the junction to the load. A gate driver activates the devices according to upper and lower gate signals in response to pulse-width modulation (PWM) to generate nominal gate signals from a variable duty cycle. When the positive current direction is detected then the upper gate signal has turn-on and turn-off times shifted by a predetermined offset with respect to the nominal signals, and dead-times are added to the lower gate signals. When the negative direction is detected then the lower gate signal has turn-on and turn-off times shifted by the predetermined offset with respect to the nominal signals, and dead-times are added to the upper gate signals.

17 Claims, 5 Drawing Sheets

(51) Int. Cl.
*H02P 3/00* (2006.01)
*H02P 7/06* (2006.01)
*H02P 27/04* (2016.01)
*H02P 27/08* (2006.01)
*H02M 7/5387* (2007.01)
*H02M 5/458* (2006.01)
*G01R 31/42* (2006.01)
*G01R 19/00* (2006.01)
*H02M 1/38* (2007.01)

(52) U.S. Cl.
CPC .............. *G01R 31/42* (2013.01); *H02M 5/458* (2013.01); *H02M 2001/385* (2013.01); *H02P 27/04* (2013.01)

(58) Field of Classification Search
USPC ........... 318/503, 559, 400.29, 400.1, 400.17, 318/400.27, 400.28
See application file for complete search history.

(56) References Cited

U.S. PATENT DOCUMENTS

| | | | |
|---|---|---|---|
| 6,998,801 B2 * | 2/2006 | Kurosawa | H02P 6/28 318/400.27 |
| 7,151,406 B2 | 12/2006 | Labbé | |
| 7,187,149 B1 | 3/2007 | Balog, Jr. et al. | |
| 7,391,194 B2 | 6/2008 | Brown | |
| 7,589,506 B2 | 9/2009 | Brown | |
| 7,615,887 B2 | 11/2009 | Stancu et al. | |
| 7,659,679 B2 | 2/2010 | Raja et al. | |
| 7,724,054 B2 | 5/2010 | Honda et al. | |
| 8,289,010 B1 | 10/2012 | Fernald et al. | |
| 8,520,420 B2 | 8/2013 | Jungreis et al. | |
| 2007/0249461 A1 * | 10/2007 | Tsuji | B60K 1/02 477/3 |
| 2009/0066384 A1 * | 3/2009 | Suzuki | G06F 1/025 327/184 |
| 2013/0069570 A1 | 3/2013 | Chen et al. | |
| 2013/0088905 A1 | 4/2013 | Lee et al. | |
| 2013/0200828 A1 | 8/2013 | Miller et al. | |
| 2014/0042948 A1 | 2/2014 | Green et al. | |
| 2014/0225543 A1 * | 8/2014 | Maekawa | H02P 27/085 318/400.17 |
| 2014/0226369 A1 | 8/2014 | Kimura et al. | |
| 2015/0124502 A1 * | 5/2015 | Watanabe | H02M 1/08 363/97 |

OTHER PUBLICATIONS

Murai et al, Waveform Distortion and Correction Circuit for PWM Inverters with Switching Lag-Times, IEEE Transactions on Industry Applications, vol. IA-23, No. 5, Sep./Oct. 1987.

* cited by examiner

POWER CONVERTER WITH PRE-COMPENSATION FOR DEAD-TIME INSERTION

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to power converters including inverters for an electric drive system of an electrified vehicle, and, more specifically, to pre-compensating gate drive signals for controlling switching devices so that dead-time intervals can be inserted without introducing any significant distortion in the output of the converter.

Electric vehicles, such as hybrid electric vehicles (HEVs), plug-in hybrid electric vehicles (PHEVs), and battery electric vehicles (BEVs), use inverter-driven electric machines to provide traction torque and regenerative braking torque. A typical electric drive system includes a DC power source (such as a battery pack or a fuel cell) coupled by contactor switches to a variable voltage converter (VVC) to regulate a main bus voltage across a main DC linking capacitor. An inverter is connected between the main buses for the DC link and a traction motor in order to convert the DC power to an AC power that is coupled to the windings of the motor to propel the vehicle. A second inverter may also be connected between the main bus and a generator (if present) to provide another power flow path from a prime mover, typically an internal combustion engine, to the DC link.

The inverters include transistor switching devices (such as insulated gate bipolar transistors, or IGBTs) connected in a bridge configuration including a plurality of phase legs. A typical configuration includes a three-phase motor driven by an inverter with three phase legs. An electronic controller turns the switches on and off in order to invert a DC voltage from the bus to an AC voltage applied to the motor, or to rectify an AC voltage from the generator to a DC voltage on the bus. In each case, the inverters are controlled in response to various sensed conditions including the rotational position of the electric machine and the current flow in each of the phases.

The inverter for the motor may preferably pulse-width modulate the DC link voltage in order to deliver an approximation of a sinusoidal current output to drive the motor at a desired speed and torque. Pulse Width Modulation (PWM) control signals applied to the gates of the IGBTs turn them on and off as necessary so that the resulting current matches a desired current.

Because each phase leg of the inverter has a pair of upper and lower switching devices connected across the DC link, it is important that both devices not be conducting (i.e., turned-on) simultaneously. Otherwise, the resulting "shoot-through" of the phase leg could result in damage to the switching devices. A short time interval during which both the upper and lower switching devices of a phase leg are turned off, known as a dead-time, is typically used in connection with PWM control of inverters in order to prevent shoot-through. However, the insertion of a dead-time has resulted in distortion of the output waveform delivered to the load and the introduction of control delays.

SUMMARY OF THE INVENTION

In one aspect of the invention, a power converter is comprised of a DC link configured to receive a DC supply voltage and at least one phase leg. The phase leg comprises an upper switching device and a lower switching device coupled across the DC link. A junction between the upper and lower switching devices is configured to be coupled to a load. A current sensor for the phase leg detects a positive or negative direction of a current flow from the junction to the load. A gate driver is coupled to the phase leg to activate the upper switching device according to an upper gate signal and activate the lower switching device according to a lower gate signal in response to pulse-width modulation (PWM) to generate nominal gate signals from a variable duty cycle. When the positive current direction is detected then the upper gate signal has a turn-on time and a turn-off time each shifted by a predetermined offset with respect to the nominal gate signals, and the lower gate signal has a turn-on time delayed with respect to a corresponding turn-off time of the upper gate signal and has a turn-off time advanced with respect to a corresponding turn-on time of the upper gate signal. When the negative current direction is detected then the lower gate signal has a turn-on time and a turn-off time each shifted by a predetermined offset with respect to the nominal gate signals, and the upper gate signal has a turn-on time delayed with respect to a corresponding turn-off time of the lower gate signal and has a turn-off time advanced with respect to a corresponding turn-on time of the lower gate signal.

DETAILED DESCRIPTION OF PREFERRED EMBODIMENTS

Figure 1:
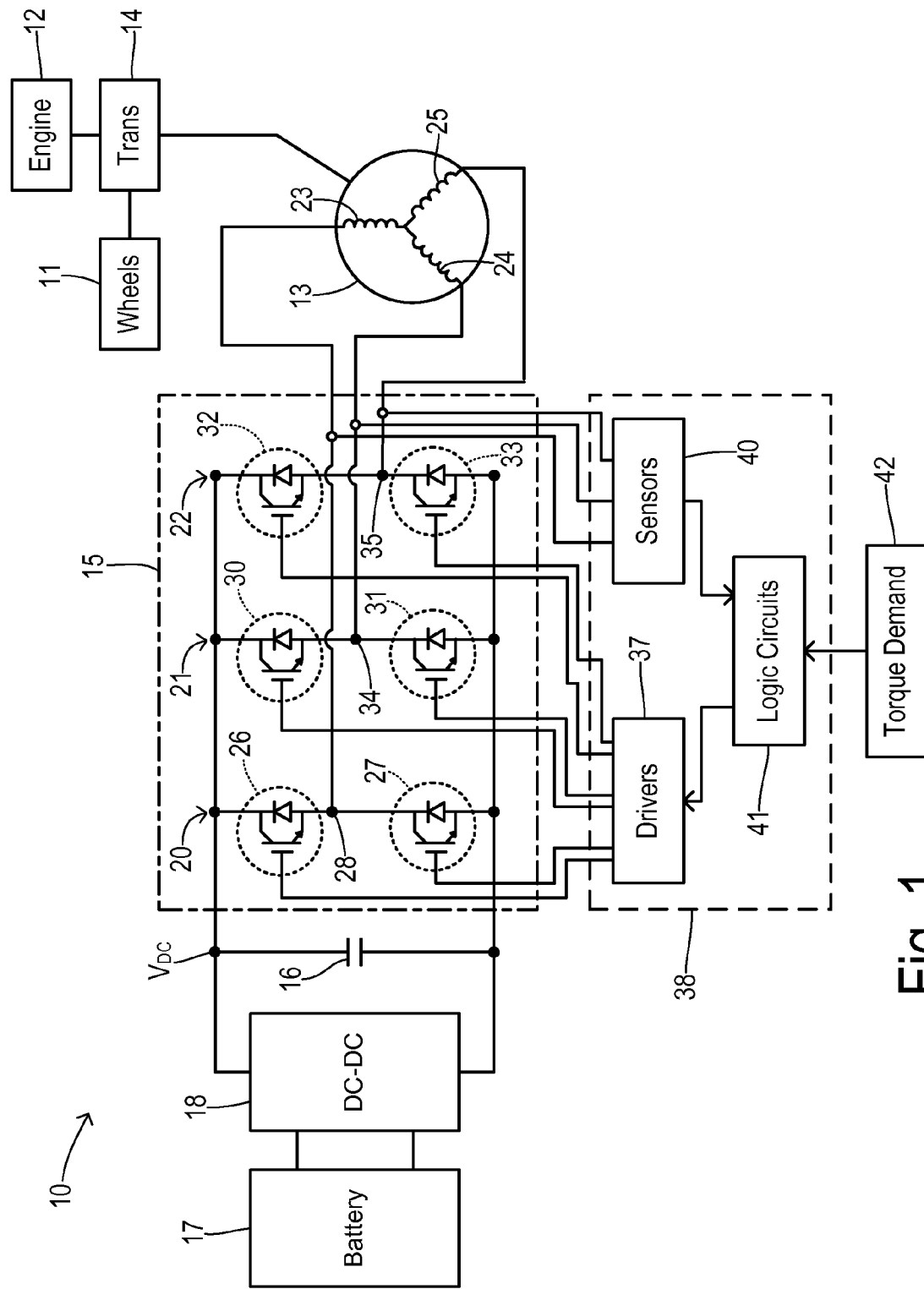
FIG. 1 is a schematic, block diagram showing a powertrain of an electrified vehicle according to one embodiment of the present invention.

FIG. 1 shows a hybrid electric vehicle 10 as one type of vehicle for implementing the dead-time insertion of the present invention. Vehicle wheels 11 may be driven by an internal combustion engine 12 and/or by a traction motor 13 via a transmission 14. For providing electric propulsion, motor 13 may be driven via an inverter 15 that receives a DC link voltage at a DC link capacitor 16. The DC link voltage may result from conversion of DC power from a battery pack 17 by a converter 18 as known in the art.

Inverter 15 includes phase legs 20, 21, and 22 coupled to motor phase windings 23, 24, and 25. Phase leg 20 has an upper switching device 26 and a lower switching device 27 connected in series across DC link 16 and providing a junction 28 between devices 26 and 27 which is connected to winding 23 of motor 13. Similarly, phase leg 21 his upper switching device 30 and lower switching device 31, while phase leg 22 has upper switching device 32 and lower switching device 33. Junctions 34 and 35 are coupled to motor windings 24 and 25, respectively.

The switching devices may be comprised of IGBTs, antiparallel diodes, wide band gap FETs, or other devices. Each of the upper and lower switching devices has a respective gate terminal coupled to drivers 37 in a controller 38. Current sensors 40 coupled to each of the junctions of the phase legs measure the current flow through each phase winding. Measured current magnitudes are provided from sensors 40 to logic circuits 41 in controller 38 for use in determining PWM switching signals to be applied to the switching devices by drivers 37. As known in the art, the measured current may be compared with a desired motor current as determined according to a torque demand 42 that may be derived from operator input such as an accelerator pedal so that the operator can control the vehicle speed. Thus, current feedback determines a PWM duty cycle within logic circuits 41 that is then used to generate the timing of PWM switching signals for the phase leg switching devices.

Figure 2:
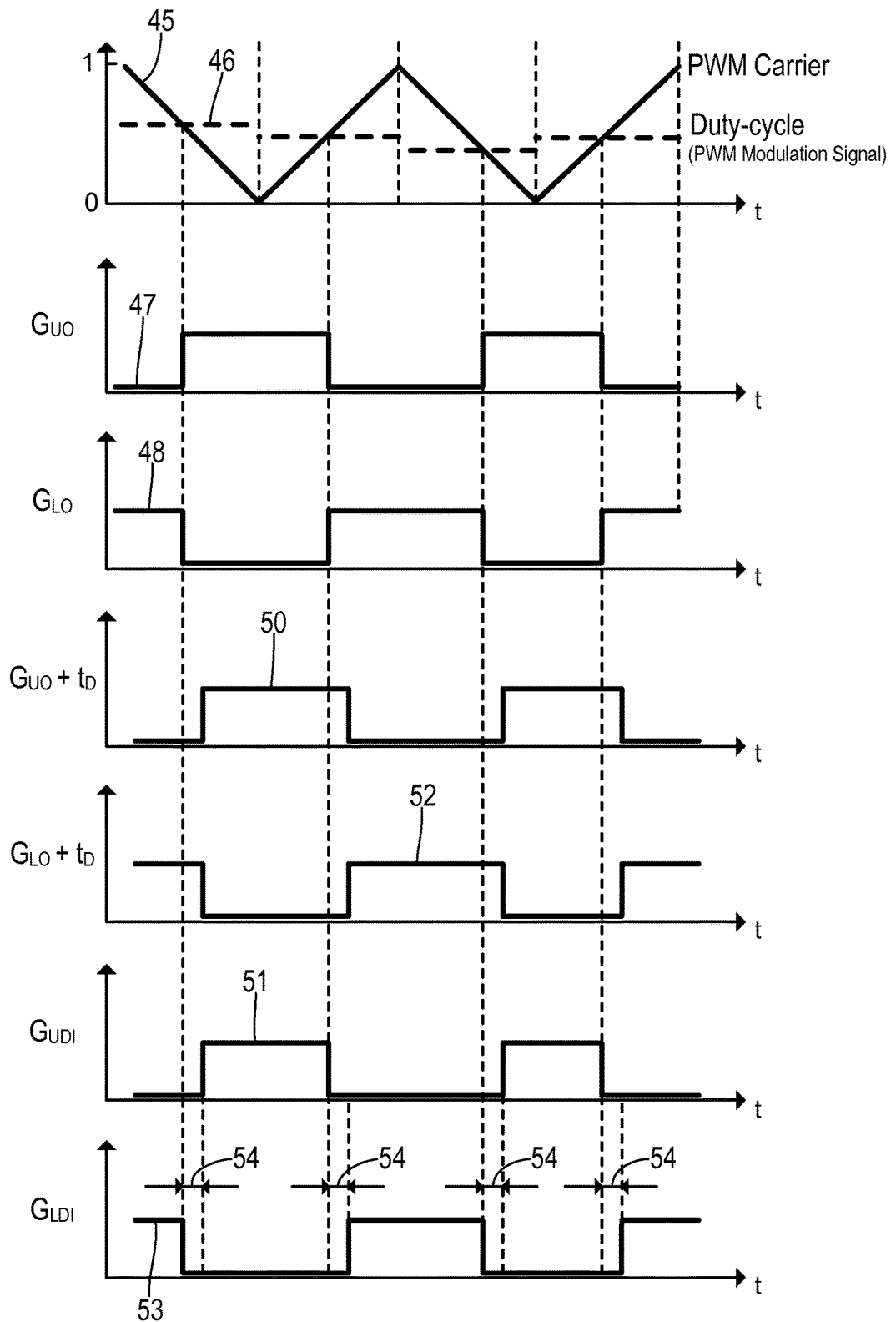
FIG. 2 is a waveform diagram showing the generation of gate signals with and without an inserted dead-time.

FIG. 2 shows a PWM carrier signal 45 which is generated as a triangular waveform at a high frequency (e.g., around 5 kHz) as compared to the rotation frequency of the motor. Using a known PWM method for generating gate-drive switching signals based on current-control, a PWM duty-cycle signal 46 is generated in response to any error between detected current and a target current. Duty-cycle 46 is compared with PWM carrier signal 45 to generate the PWM signals shown below in FIG. 2. A signal 47 is an original upper device gate signal $G_{UO}$ which has a low logic level when PWM carrier signal 45 is greater than duty cycle signal 46 and which has a high logic level when duty cycle signal 46 is greater than PWM carrier signal 45. A signal 48 shows an original lower device gate signal $G_{LO}$ which is the logical inverse of $G_{UO}$ signal 47. These original (i.e., nominal) gate signals can be generated other than by use of a PWM carrier signal, such as by direct numerical calculation.

To avoid shoot-through that could occur using original gate signals 47 and 48, a conventional dead-time insertion has been performed as follows. A waveform 50 is obtained by introducing a time delay (e.g., a fixed dead-time delay $t_D$) into signal 47. The fixed time delay represents a sufficiently long dead-time insertion that avoids simultaneous activation of both upper and lower switching devices that could occur as a result of noise or propagation delay differences between the upper and lower gate signals (typically having a duration of several microseconds). A dead-time-inserted upper switching device gate signal ($G_{UDI}$) 51 is obtained by AND-gating (i.e., forming a logical AND) of original gate signal 47 and delayed gate signal 50. A signal 52 shows a time delayed version of lower gate signal 48 using the same fixed delay $t_D$. A dead-time-inserted lower switching device gate signal ($G_{LDI}$) 53 is generated as a logical AND of original lower device gate signal 48 and delayed signal 52. In the prior art, dead-time inserted upper and lower gate signals 51 and 53 ($G_{UDI}$ and $G_{LDI}$), respectively, have been used to drive the phase leg switching devices under all conditions (i.e., with a dead-time 54 being inserted at every switching event) wherein each positive transition of a switching device turning on has been delayed while each negative transition of a switching device turning off is unchanged.

Figure 3:
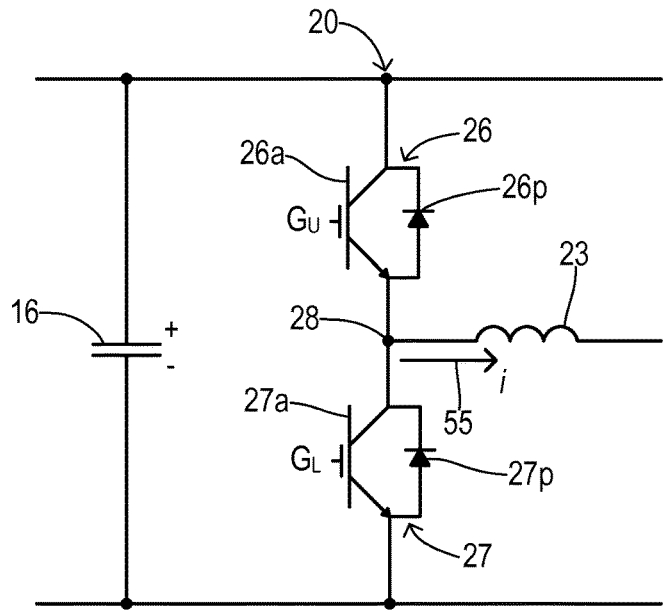
FIG. 3 is a schematic diagram showing one phase leg.

FIG. 3 shows phase leg 20 in greater detail wherein a generally sinusoidal flow 55 of current i has a positive direction when flowing from junction 28 into motor phase winding 23 and a negative direction when flowing from winding 23 to junction 28. During times when the phase current is positive, then commutations are occurring between an active upper switching device 26a and a passive lower switching device 27p. In other words, even though both active devices 26a and 27a are alternately activated, only the active upper device 26a is turned on and the lower active device 27a carries no current because the current direction is against it. The lower passive device 27p carries the current during the time period in which the upper active device 26a is not activated. Similarly, when the phase current is negative, commutations occur between a passive upper device 26p and active lower device 27a.

The original, nominal PWM switching signals (prior to dead-time insertion) operates by providing a phase voltage v intended to achieve a target current i as follows:

$$i(t) = \frac{1}{L}\int_{t0}^{t} v \cdot dt + i(t0)$$

where L is the phase inductance. The integral has the unit of volt-second. Dead-time insertion creates either missing or extra volt-seconds (depending on current direction) which creates the current distortion. The present invention seeks to pre-compensate the PWM-generated signals to take into account the missing or extra volt-second to be introduced by the dead-time insertion so that the load current distortion is avoided. More specifically, when the detected current direction is positive, then the upper gate signal has a turn-on time and a turn-off time each shifted by a predetermined offset (e.g., equal to a dead-time $t_D$) with respect to the nominal gate signals. Since they are shifted equally there is no deviation of the total volt-seconds delivered by the active upper switching device. The lower gate signal has an added dead-time which is created by delaying its turn-on time with respect to a corresponding turn-off time of the upper gate signal and advancing its turn-off time with respect to a corresponding turn-on time of the upper gate signal. Since the lower switching device is passive, the dead-time insertion is accomplished without creating distortion.

When the detected current direction is negative, then the lower gate signal has a turn-on time and a turn-off time each shifted by the predetermined offset (e.g., equal to a dead-time $t_D$) with respect to the nominal gate signals. Since they are shifted equally there is no deviation of the total volt-seconds delivered by the active lower switching device. The upper gate signal is generated with an added dead-time which is created by delaying its turn-on time with respect to a corresponding turn-off time of the lower gate signal and advancing its turn-off time with respect to a corresponding turn-on time of the lower gate signal. Since the upper switching device is passive in this case, the dead-time insertion is accomplished without creating distortion.

Figure 4:
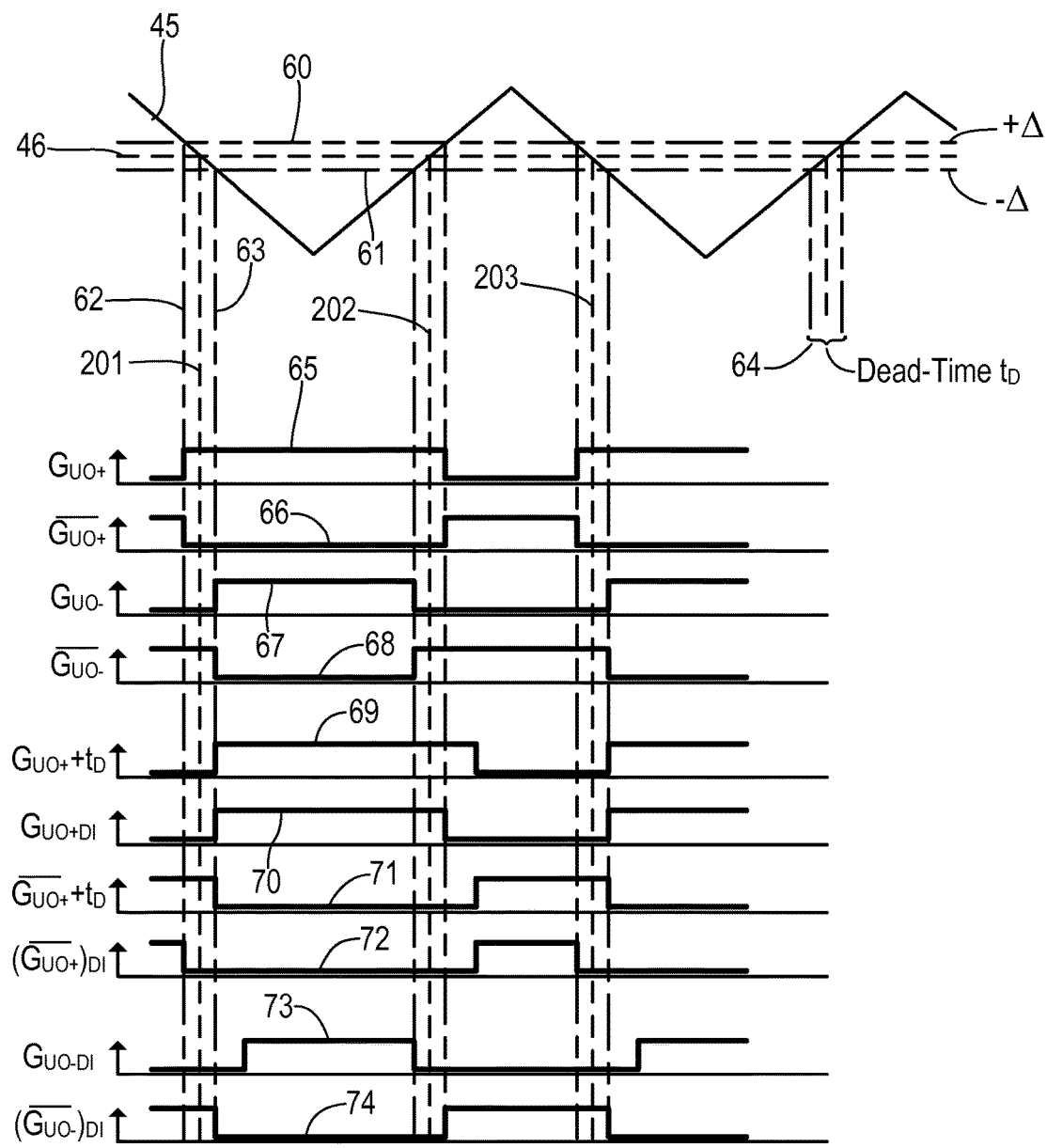
FIG. 4 is a waveform diagram showing a modification of original (i.e., nominal) gate drive signals wherein a dead-time can be subsequently inserted into a gate drive signal substantially without distortion.

FIG. 4 shows signal waveforms for one preferred method of generating pre-compensated dead-time inserted gate signals. In this method, the PWM carrier signal is compared with offset duty cycle signals instead of with the nominal value of the conventionally-obtained variable duty cycle. Thus, current feedback is used to determine the nominal target value of duty cycle signal 46. A "+Δ" or "positive-offset" duty cycle signal 60 is obtained by adding a predetermined offset to duty cycle signal 46. A "−Δ" or "negative-offset" duty cycle signal 61 is obtained by subtracting the predetermined offset from duty cycle signal 46. PWM carrier signal 46 has a predetermined slope. In view of the slope and the difference between the positive-offset and negative-offset duty cycles (which is equal to two times the predetermined offset), a dead-time window 64 defines a time interval equal to the desired dead-time $t_D$. Dead-time window 64 is centered upon the nominal switch transition time without dead-time insertion.

Based on the comparisons using the positive-offset duty cycle and the negative-offset duty cycle, separate pairs of dead-time inserted gate signals are derived for use when current direction is positive or negative as follows. Comparison of the PWM carrier with a positive-offset duty cycle produces an upper original positive-offset gate signal $G_{UO+}$ shown as a waveform 65. For the purpose of producing a corresponding gate signal for the lower switching device, the upper gate signal is inverted to provide a signal $\overline{G_{UO+}}$ shown as a waveform 66. Gate signals $G_{UO+}$ and $\overline{G_{UO+}}$ are pre-compensated signals providing the basis for forming dead-time inserted gate signals to be used when the current direction is positive.

Comparison of the PWM carrier with a negative-offset duty cycle produces an upper original negative-offset gate signal $G_{UO-}$ shown as a waveform 67. For the purpose of producing a corresponding gate signal for the lower switching device, the upper gate signal is inverted to provide a signal $\overline{G_{UO-}}$ shown as a waveform 68. Gate signals $G_{UO-}$ and $\overline{G_{UO-}}$ are pre-compensated signals providing the basis for forming dead-time inserted gate signals to be used when the current direction is negative.

The pre-compensated signals are modified to introduce dead-time intervals using the delaying and AND-gating process. Thus, the upper original positive-offset gate signal $G_{UO+}$ is delayed by dead-time $t_D$ to produce a delayed signal shown as a waveform 69. AND-gating of waveform 69 with undelayed waveform 65 produces an upper dead-time-inserted positive-offset gate signal $G_{UO+DI}$ shown as waveform 70. For the lower gate signal, inverted waveform $\overline{G_{UO+}}$ is delayed in order to generate a waveform 71 which is ANDed with waveform 66 to produce a lower dead-time-inserted positive-offset gate signal $(\overline{G_{UO+}})_{DI}$ shown as a waveform 72. The positive-offset duty cycle corresponds to a positive load current, so that when load current is positive, waveforms 70 and 72 (corresponding to $G_{UO+DI}$ and $(\overline{G_{UO+}})_{DI}$ respectively) are selected as the gate drive signals $G_U$ and $G_L$.

For a negative load current, the negative-offset duty cycle is used for generating the gate drive signals. Thus, upper original negative-offset gate signal $G_{UO-}$ is delayed, and then the delayed and undelayed signals are AND-gated to produce an upper dead-time-inserted negative-offset gate signal $G_{UO-DI}$ shown as waveform 73. Inverted waveform $\overline{G_{UO-}}$ is delayed, and then the delayed and undelayed signals are AND-gated to produce a lower dead-time-inserted negative-offset gate signal $(G_{UO-})_{DI}$ shown as a waveform 74.

If the nominal duty cycle 46 were to be used for generating nominal gate signals using PWM carrier 45 in FIG. 4, the gate signal edges would occur at 201, 202 and 203. It may be noted that there is no duty cycle deviation for the upper device in the dead-time inserted gate signal combination of $G_{UO+DI}$ and $(\overline{G_{UO+}})_{DI}$ namely, the logical high period of $G_{UO+DI}$ 70 is the same as the time period from the edge 201 to edge 202. Therefore, there is no extra or missing volt-second for the positive current direction. Similarly, there is no duty cycle deviation for the lower device in the dead-time inserted gate signal combination of $G_{UO-DI}$ and $(\overline{G_{UO-}})_{DI}$, namely logical high period of $(G_{UO-})_{DI}$ 74 is the same as the time period from the edge 202 to edge 203. Therefore, there is no extra or missing volt-second for the negative current direction.

Figure 5:
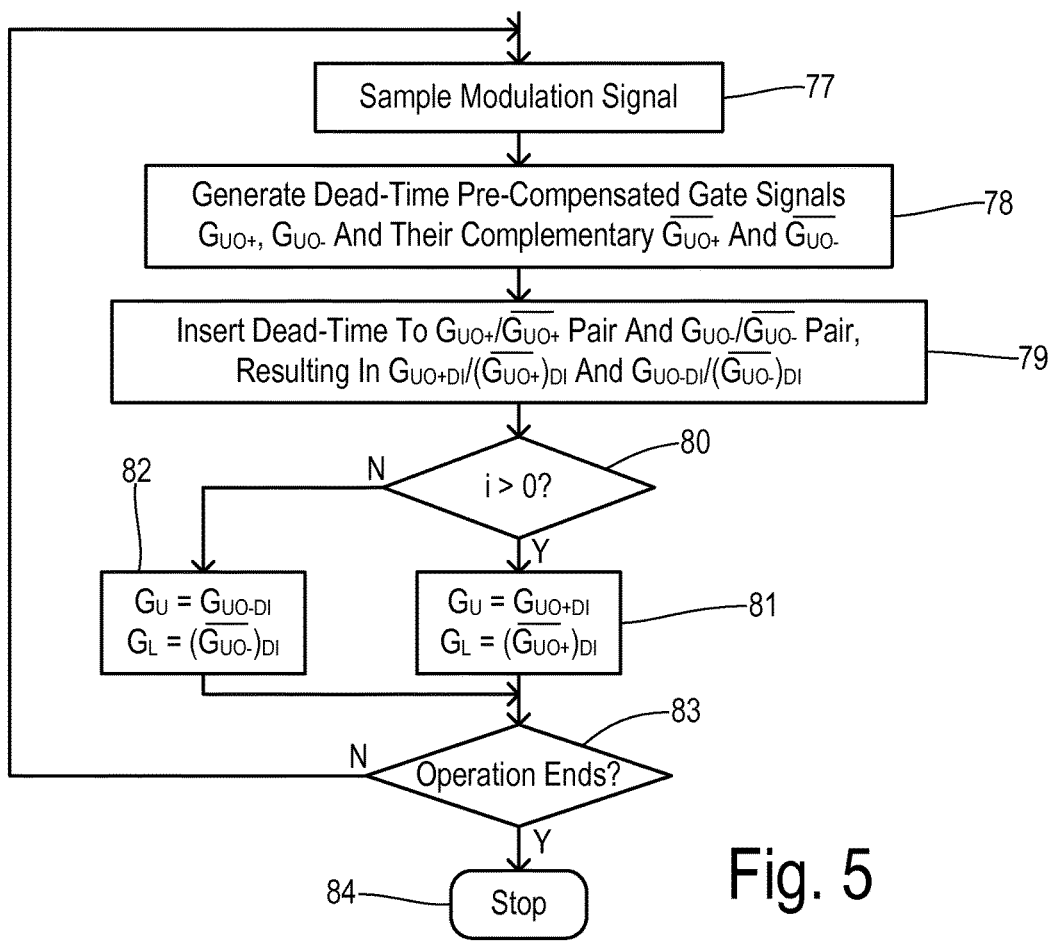
FIG. 5 is a flowchart showing one preferred method of the invention.

A preferred method is shown in FIG. 5 wherein upper and lower gate signals for both the positive and negative current directions are continuously generated, and wherein the corresponding gate signals are selected for the gate driver in response to the detected current direction. A pulse width modulation duty cycle signal (signal 46 of FIG. 2) is sampled in step 77. Pre-compensated gate signals are generated in step 78 by comparing the PWM carrier signal with positive-offset and negative-offsets formed by adding to and subtracting from the duty cycle command by a predetermined offset. In step 79, dead-time inserted gate signal pairs are generated for the upper and lower switching devices, one pair corresponding to a positive direction of the load current and the other pair corresponding to a negative direction of the load current. A check is performed in step 80 to determine whether the instantaneous current for the phase leg is greater than zero (i.e., whether the direction is positive). If yes, then the dead-time-inserted signals that are pre-compensated using the positive offset duty cycle (namely $G_{UO+DI}$ and $(\overline{G_{UO+}})_{DI}$) are used for gate drive signals $G_U$ and $G_L$ in step 81. If no, then the dead-time-inserted signals that are pre-compensated using the negative offset duty cycle (namely $G_{UO-DI}$ and $(\overline{G_{UO-}})_{DI}$) are used for gate drive signals $G_U$ and $G_L$ in step 82. A check is performed in step 83 to determine whether motor operation has ended. If not, then a return is made to step 77 to continue sampling the modulation signal, otherwise the method stops at step 84.

Figure 6:
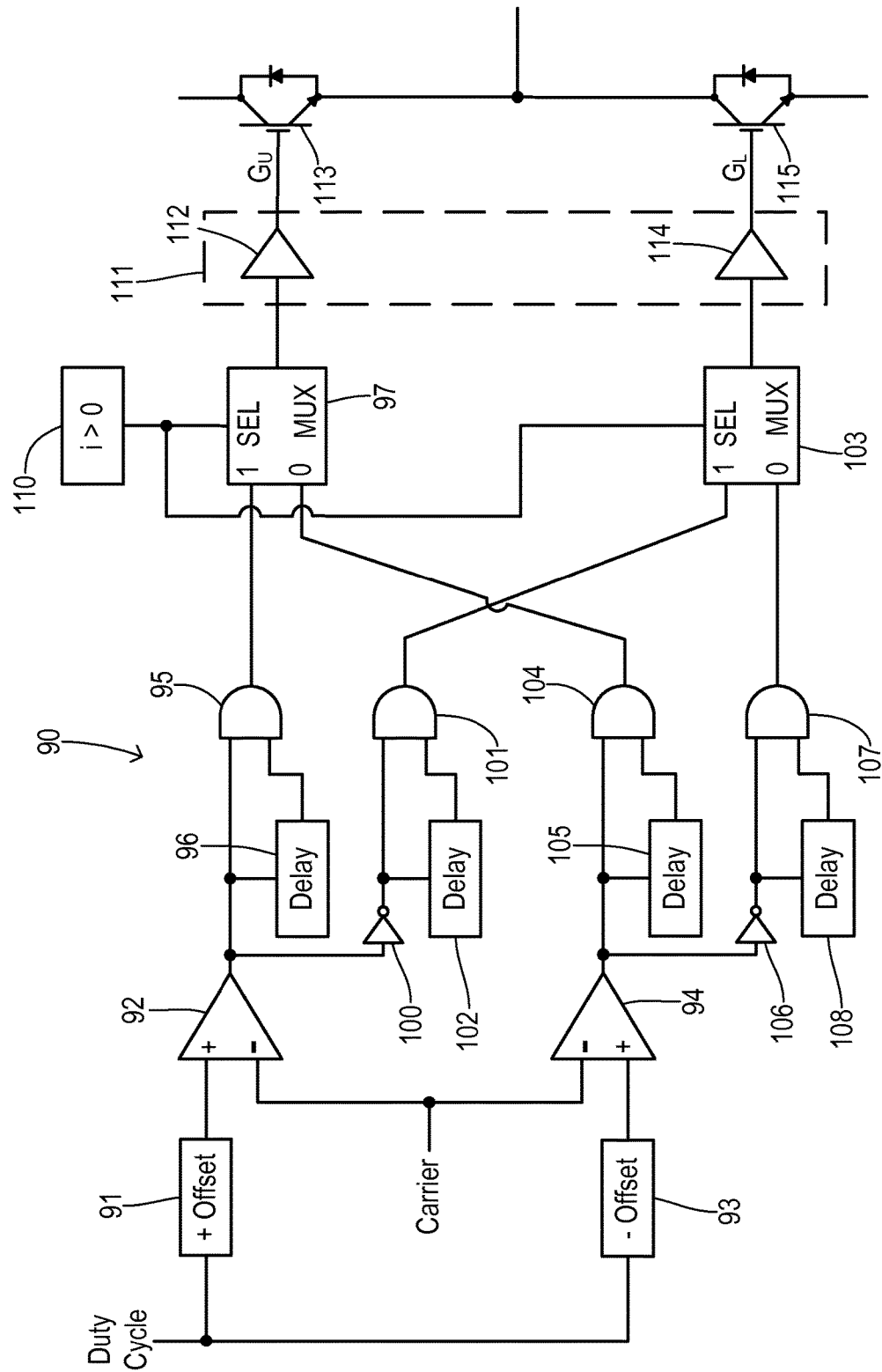
FIG. 6 is a block diagram showing a circuit according to one preferred embodiment of the invention.

FIG. 6 shows a logic circuit 90 for pre-compensation of gate signals so that insertion of dead-times does not result in current distortion. Logic circuit 90 may include dedicated electronic circuit components as shown or may be implemented using a programmable controller such as a microcontroller. A PWM duty cycle command (e.g., generated using conventional PWM control methods) is increased in an adder 91 by a predetermined offset. The magnitude of the offset corresponds to one-half of the desired dead-time interval, and further depends on the slope of the PWM carrier signal. More specifically, the difference between the positive-offset duty cycle and the negative-offset duty cycle (i.e., twice the size of the predetermined offset) divided by the slope should be equal to the desired dead-time interval $t_D$.

The positive-offset duty cycle from adder 91 is coupled to a noninverting input of a comparator 92. The PWM carrier signal is coupled to an inverting input of comparator 92. In response to the comparison, comparator 92 outputs an original upper gate drive signal $G_{UO+}$ to a first input of an AND-gate 95. In a similar manner, a negative-offset duty cycle formed by an adder 93 that subtracts the predetermined offset from the commanded duty cycle is coupled to a noninverting input of a comparator 94. Comparator 94 outputs an original upper gate drive signal $G_{UO-}$ to a first input of an AND-gate 104 by comparing the negative-offset duty cycle with the PWM carrier signal which it receives at its inverting input.

The output of comparator 92 is delayed by a dead-time interval $t_D$, in a delay block 96 for providing a second input to AND-gate 95. The output of AND-gate 95 corresponds to the $G_{UO+DI}$ signal, and it is coupled to a first input of a multiplexer 97. The input is a one-selected input which passes through multiplexer 97 when a high logic level (binary "1") signal is present at a Select input (SEL) of multiplexer 97.

The output of comparator 92 is inverted by an inverter 100 to provide an original pre-compensated lower gate drive signal which is coupled to one input of an AND-gate 101. The output of inverter 100 is delayed by the dead-time interval $t_D$, in a delay block 102 for providing to a second input of AND-gate 101. The output of AND-gate 101 corresponds to the $\overline{(G_{UO+})_{DI}}$ signal, and it is coupled to a first input of a multiplexer 103. The input is a one-selected input which passes through multiplexer 103 when a high logic level (binary "1") signal is present at a Select input (SEL) of multiplexer 103.

The output of comparator 94 is delayed by dead-time interval $t_D$ in a delay block 105 for providing a second input to AND-gate 104. The output of AND-gate 104 corresponds to the $G_{UO-DI}$ signal, and it is coupled to a second input of multiplexer 97. The input is a zero-selected input which passes through multiplexer 97 when a low logic level (binary "0") signal is present at the Select input (SEL) of multiplexer 97.

The output of comparator 94 is inverted by an inverter 106 to provide an original pre-compensated lower gate drive signal which is coupled to one input of an AND-gate 107. The output of inverter 106 is delayed by the dead-time interval $t_D$ in a delay block 108 for providing to a second input of AND-gate 107. The output of AND-gate 107 corresponds to the $\overline{(G_{UO-})_{DI}}$ signal, and it is coupled to a second input of multiplexer 103. The input is a zero-selected input which passes through multiplexer 103 when a low logic level (binary "0") signal is present at the Select input (SEL) of multiplexer 103.

A comparison block 110 compares a detected value of the instantaneous current flowing in the corresponding phase to zero, in order to determine a positive or negative direction of current flow from the phase leg to the load. When the direction is positive, block 110 provides a high logic level to the SEL inputs of multiplexers 97 and 103. Otherwise, a negative current causes block 110 to provide a low logic level to the SEL inputs of multiplexers 97 and 103. Consequently, the appropriate pair of dead-time-inserted gate signals are applied to the inputs of amplifiers 112 and 114 in a driver 111, and phase leg switching devices 113 and 115 operate with a desired dead-time without creating any current distortion.

What is claimed is:

1. A power converter comprising:
    a DC link configured to receive a DC supply voltage;
    a phase leg comprising an upper switching device and a lower switching device coupled across the DC link, wherein a junction between the upper and lower switching devices is configured to be coupled to a load;
    a current sensor for the phase leg detecting a positive or negative direction of a current flow from the junction to the load; and
    a gate driver coupled to the phase leg activating the upper switching device according to an upper gate signal and activating the lower switching device according to a lower gate signal in response to pulse-width modulation (PWM) to generate nominal gate signals from a variable duty cycle;
    wherein when the positive current direction is detected then the upper gate signal has a turn-on time and a turn-off time each shifted by a predetermined offset with respect to the nominal gate signals, and the lower gate signal has a turn-on time delayed with respect to a corresponding turn-off time of the upper gate signal and has a turn-off time advanced with respect to a corresponding turn-on time of the upper gate signal; and
    wherein when the negative current direction is detected then the lower gate signal has a turn-on time and a turn-off time each shifted by a predetermined offset with respect to the nominal gate signals, and the upper gate signal has a turn-on time delayed with respect to a corresponding turn-off time of the lower gate signal and has a turn-off time advanced with respect to a corresponding turn-on time of the lower gate signal.

2. The power converter of claim 1 wherein the upper and lower gate signals for both the positive and negative current directions are continuously generated, and wherein the corresponding gate signals are selected for the gate driver in response to the detected current direction.

3. The power converter of claim 1 wherein the pulse-width modulation includes a PWM carrier signal, wherein the upper and lower gate signals are generated when the positive current direction is detected by comparing the PWM carrier signal with a positive offset from the variable duty cycle, and wherein the upper and lower gate signals are generated when the negative current direction is detected by comparing the PWM carrier signal with a negative offset from the variable duty cycle.

4. The power converter of claim 3 wherein the gate signals are generated by AND-gating each of the comparison signals with a respective delayed comparison signal, wherein the delayed comparison signals are delayed according to a predetermined dead-time $t_D$.

5. The power converter of claim 3 wherein the carrier signal has a predetermined slope, and wherein a difference between the positive offset and the negative offset divided by the predetermined slope is equal to the predetermined dead-time $t_D$.

6. The power converter of claim 5 wherein the carrier signal is comprised of a triangle waveform.

7. The power converter of claim 1 further comprising:
    a second phase leg comprising a second upper switching device and a second lower switching device coupled across the DC link, wherein a second junction between the second upper and lower switching devices is configured to be coupled to the load;
    a second current sensor for the second phase leg detecting a positive or negative direction of a second current flow from the second junction to the load; and
    a second gate driver coupled to the second phase leg activating the second upper switching device according to a second upper gate signal and activating the second lower switching device according to a second lower gate signal in response to a second PWM carrier signal to generate nominal second gate signals from the variable duty cycle;
    wherein when the positive second current direction is detected then the second upper gate signal has a turn-on time and a turn-off time each shifted by the predetermined offset with respect to the nominal second gate signals, and the second lower gate signal has a turn-on time delayed with respect to a corresponding turn-off time of the second upper gate signal and has a turn-off time advanced with respect to a corresponding turn-on time of the second upper gate signal; and
    wherein when the negative second current direction is detected then the second lower gate signal has a turn-on time and a turn-off time each shifted by a second predetermined offset with respect to the nominal second gate signals, and the second upper gate signal has a turn-on time delayed with respect to a corresponding turn-off time of the second lower gate signal and has a turn-off time advanced with respect to a corresponding turn-on time of the second lower gate signal.

8. The power converter of claim 1 wherein the load is comprised of an electric traction motor for a road vehicle, and wherein the variable duty cycle corresponds to a desired torque from the traction motor.

9. A method controlling a power converter comprising:
generating pulse-width modulated (PWM) upper and lower gate signals for driving respective switching devices in a phase leg;
detecting a current direction from the phase leg to a load;
when the direction is positive, inserting a dead-time equally delaying both turn-on and turn-off in the upper gate signal and delaying turn-on and advancing turn-off in the lower gate signal.

10. The method of claim 9 further comprising the step of:
when the direction is negative, inserting a dead-time equally delaying both turn-on and turn-off in the lower gate signal and delaying turn-on and advancing turn-off in the upper gate signal.

11. The method of claim 10 wherein the inserting steps are comprised of:
comparing a PWM carrier signal with a positive offset from a variable PWM duty cycle to generate a first comparison signal;
comparing the PWM carrier signal with a negative offset from the variable PWM duty cycle to generate a second comparison signal; and
AND-gating each of the comparison signals with a respective delayed comparison signal, wherein the delayed comparison signals are delayed according to a predetermined dead-time $t_D$.

12. The method of claim 11 wherein the carrier signal has a predetermined slope, and wherein a difference between the positive offset and the negative offset divided by the predetermined slope is equal to the predetermined dead-time $t_D$.

13. The method of claim 10 wherein the carrier signal is comprised of a triangle waveform.

14. A power converter comprising:
a DC link configured to receive a DC supply voltage;
a phase leg comprising an upper switching device and a lower switching device coupled across the DC link, wherein a junction between the upper and lower switching devices is configured to be coupled to a load;
a current sensor for the phase leg detecting a positive or negative direction of a current flow from the junction to the load; and
a gate driver coupled to the phase leg activating the upper switching device according to an upper gate signal and activating the lower switching device according to a lower gate signal; and
a controller 1) generating positive and negative duty cycle offsets from a commanded duty cycle, 2) comparing a PWM carrier signal to the duty cycle offsets to generate first and second comparison signals, 3) AND-gating the comparison signals with respective delayed comparison signals to generate positive and negative pre-compensated gate drive signals, wherein the delayed comparison signals are delayed according to a predetermined dead-time $t_D$, 4) selecting the positive pre-compensated gate drive signal when the direction is positive, and 5) selecting the negative pre-compensated gate drive signal when the direction is negative.

15. The power converter of claim 14 wherein the carrier signal has a predetermined slope, and wherein a difference between the positive offset duty cycle and the negative offset duty cycle divided by the predetermined slope is equal to the predetermined dead-time $t_D$.

16. The power converter of claim 15 wherein the carrier signal is comprised of a triangle waveform.

17. The power converter of claim 14 wherein the load is comprised of an electric traction motor for a road vehicle, and wherein the variable duty cycle corresponds to a desired torque from the traction motor.

* * * * *